(12) United States Patent
Enomoto et al.

(10) Patent No.: US 8,389,867 B2
(45) Date of Patent: Mar. 5, 2013

(54) MULTILAYERED CIRCUIT SUBSTRATE WITH SEMICONDUCTOR DEVICE INCORPORATED THEREIN

(75) Inventors: Ryo Enomoto, Ibi-gun (JP); Tadahiro Ohmi, Sendai (JP); Akihiro Morimoto, Sendai (JP)

(73) Assignees: Ibiden Co., Ltd., Ogaki-shi (JP); National University Corporation Tohoku University, Sendai-shi (JP)

( * ) Notice: Subject to any disclaimer, the term of this patent is extended or adjusted under 35 U.S.C. 154(b) by 1379 days.

(21) Appl. No.: 11/529,319

(22) Filed: Sep. 29, 2006

(65) Prior Publication Data
US 2007/0096289 A1     May 3, 2007

(30) Foreign Application Priority Data

Sep. 30, 2005 (JP) .................................. 2005-286440
Sep. 30, 2005 (JP) .................................. 2005-286441

(51) Int. Cl.
*H05K 1/16*     (2006.01)

(52) U.S. Cl. ........ 174/260; 361/761; 361/687; 361/764; 361/765; 361/766

(58) Field of Classification Search .................. 174/260; 361/761, 687, 764–766, 784, 709; 428/209–210
See application file for complete search history.

(56) References Cited

U.S. PATENT DOCUMENTS 5,579,207 A * 11/1996 Hayden et al. ................. 361/790
5,683,791 A * 11/1997 Horiuchi et al. .............. 428/210
6,090,468 A * 7/2000 Shimada et al. .............. 428/137
6,163,456 A * 12/2000 Suzuki et al. ................. 361/704
6,172,423 B1 * 1/2001 Lee ............................... 257/780

(Continued)

FOREIGN PATENT DOCUMENTS

JP    11-145381    5/1999
JP    2001-244408    9/2001

(Continued)

OTHER PUBLICATIONS

Coefficients of Linear Expansion, Feb. 2006, www.engineeringtoolbox.com.*

(Continued)

*Primary Examiner* — Tuan T Dinh
*Assistant Examiner* — Steven Sawyer
(74) *Attorney, Agent, or Firm* — Oblon, Spivak, McClelland, Maier & Neustadt, L.L.P.

(57) ABSTRACT

For the purpose of providing a semiconductor element built-in type multilayered circuit board in which a semiconductor element is closely joined to a recess of an insulating substrate to effectively disperse heat generated from the semiconductor element through the insulating substrate at a working temperature region of the semiconductor element circuit board, to surely conduct an electrical connection of an electronic part such as semiconductor element or the like in a short wiring and to enable the high density mounting of semiconductor elements, miniaturization and increase of working speed, there is proposed a semiconductor element built-in type multilayered circuit board formed by laminating a plurality of semiconductor element built-in type boards each comprising an insulating substrate and a semiconductor element accommodated in a recess formed therein, characterized in that a difference between a linear expansion coefficient of the insulating substrate and a linear expansion coefficient of the semiconductor element in a temperature zone of 20-300° C. is less than $1 \times 10^{-5}$/K.

10 Claims, 2 Drawing Sheets

U.S. PATENT DOCUMENTS

| | | | |
|---|---|---|---|
| 6,188,127 B1 * | 2/2001 | Senba et al. ................ 257/686 |
| 2003/0012006 A1 * | 1/2003 | Silverman .................... 361/760 |
| 2003/0026060 A1 * | 2/2003 | Hiramatsu et al. ............ 361/311 |
| 2003/0062624 A1 * | 4/2003 | Asahi et al. .................... 257/758 |
| 2005/0146854 A1 * | 7/2005 | Ikuta et al. .................... 361/719 |
| 2005/0185382 A1 * | 8/2005 | Ooi et al. ...................... 361/718 |

FOREIGN PATENT DOCUMENTS

| | | |
|---|---|---|
| JP | 2002-170924 | 6/2002 |
| JP | 2003-17638 | 1/2003 |
| JP | 2003-068907 | 3/2003 |
| JP | 2003-218282 | 7/2003 |
| JP | 2005-217134 | 8/2005 |
| JP | 2005-268701 | 9/2005 |

OTHER PUBLICATIONS

[The engineering ToolBox] www.engineeringtoolbox.com, "Coefficients of Linear expansion".*

* cited by examiner

MULTILAYERED CIRCUIT SUBSTRATE WITH SEMICONDUCTOR DEVICE INCORPORATED THEREIN

INDUSTRIAL FIELD

This invention relates to a semiconductor element built-in multilayered circuit board formed by laminating a plurality of the semiconductor element built-in substrates.

BACKGROUND ART

Recently, as the circuit board for the semiconductor device is used a high-density packaged body of a structure formed by laminating a great number of LSI chips or memories (multi-chip package) due to the complication of the circuit structure in various electron devices or the high density packaging of electron parts. On the other hand, the circuit board for the semiconductor device increases the heat value per unit area of a heat dispersion face accompanied with the increase of the wiring number based on the improvement of the operating rate of LSI such as CPU or the like, the increase of consumption power through charge and discharge of the element, or the reduction of the heat dispersion face through miniaturization.

Heretofore, as the semiconductor element built-in multilayered circuit board is proposed a multilayered circuit board using an insulating substrate made of a resin in JP-A-2003-218282.

Also, JP-A-2003-17638 proposes a lamination type multichip semiconductor device arranged at a state of laminating an electron cooling element (Peltier element).

Further, JP-A-H 11-145381 proposes a semiconductor multi-chip module provided with a heat dispersion path formed from a semiconductor element packaged in a substrate toward a side face of the substrate.

SUMMARY OF THE INVENTION

The invention proposes a semiconductor element built-in type multilayered circuit board therein having a small difference in a linear expansion coefficient between an insulating substrate for a semiconductor element built-in type multilayered circuit board and a semiconductor element built therein.

Also, the invention proposes a semiconductor element built-in type multilayered circuit board capable of efficiently dispersing heat generated from a semiconductor element.

Furthermore, the invention proposes a semiconductor element built-in type multilayered circuit board capable of surely conducting an electrical connection between electronic parts such as semiconductor elements and the like in a short wiring but also attaining high density packaging of the semiconductor elements, miniaturization and increase of the operating speed.

That is, the invention is a semiconductor element built-in type multilayered circuit board formed by laminating a plurality of semiconductor element built-in type boards each comprising an insulating substrate and a semiconductor element accommodated in a recess formed therein, characterized in that a difference between a linear expansion coefficient of the insulating substrate and a linear expansion coefficient of the semiconductor element in a temperature zone of 20-300° C. is less than $1 \times 10^{-5}$/K.

Also, the invention is a semiconductor element built-in type multilayered circuit board formed by laminating a plurality of semiconductor element built-in type boards each comprising an insulating substrate and a semiconductor element accommodated in a recess formed therein, characterized in that the insulating substrate is a high thermal conductive ceramic and a difference between a linear expansion coefficient of the insulating substrate and a linear expansion coefficient of the semiconductor element in a temperature zone of 20-300° C. is less than $1 \times 10^{-5}$/K.

In the invention, it is advantageous that the semiconductor element built-in board comprises an insulating substrate having at least one recess accommodating a semiconductor element and at least one through-hole formed in a surrounding portion of the recess, a connecting path electrically connecting upper and lower faces of the insulating substrate with an electrically conducting material inside the through-hole, a semiconductor element accommodated in the recess and having on its upper face at least one electrode pad, an insulating layer covering the surfaces of the semiconductor element and the insulating substrate and having an opening portion to the connecting path and to the upper-side of the electrode pad, and a conductor wiring formed on the surface of the insulating layer and connecting the connecting path and the electrode pad.

In the invention, it is advantageous that a plurality of the above semiconductor element built-in type boards are electrically connected to each other at a laminated state through an electrically conductive bump formed on the lower face of the connecting path and that the thickness of the insulating substrate at the bottom of the recess is 10-250 μm and that the difference in the height between the surface of the electrode pad in the semiconductor element accommodated in the recess of the insulating substrate and the surface of the insulating substrate is within 10 μm.

Moreover, it is preferable that the insulating substrate is made from at least one inorganic material selected from an oxide ceramic, a carbide ceramic, a silicide ceramic, a boride ceramic, a nitride ceramic and a low-temperature fired ceramic (LTCC) and that the high thermal conductive ceramic has a thermal conductivity equal to or more than 100 W/(m·K) and that the high thermal conductive ceramic is aluminum nitride.

In the semiconductor element built-in type multilayered circuit board according to the invention, the ceramic, particularly ceramic with its linear expansion coefficient being small in the difference from that of the semiconductor element built therein is used as an insulating substrate of the semiconductor element built-in type board, so that there is not a large size difference between the semiconductor element and the insulating substrate at a working temperature region of the semiconductor element circuit board, and hence the semiconductor element can be closely joined to the recess of the insulating substrate and heat generated from the semiconductor element can be effectively discharged through the insulating substrate.

According to the invention, the insulating substrates are laminated and integrally united at a state of fitting the semiconductor element into the recess of the insulating substrate, whereby the electrical connection between the semiconductor element built-in type boards, particularly electronic parts such as the semiconductor elements and the like can be surely attained for a short time and in a short wiring, but also it is possible to attain the high density packaging and miniaturization of the semiconductor elements and the higher working speed thereof. Particularly, according to the invention, it prevents adherence inhibition between the semiconductor element and the insulating substrate and instability of the semiconductor element in the recess.

According to the invention, the quality of the multilayered circuit board is further improved because it prevents misalignment in the lamination of the plural semiconductor element built-in boards.

DETAILED EXPLANATION OF PREFERABLE EMBODIMENTS

Figure 1:
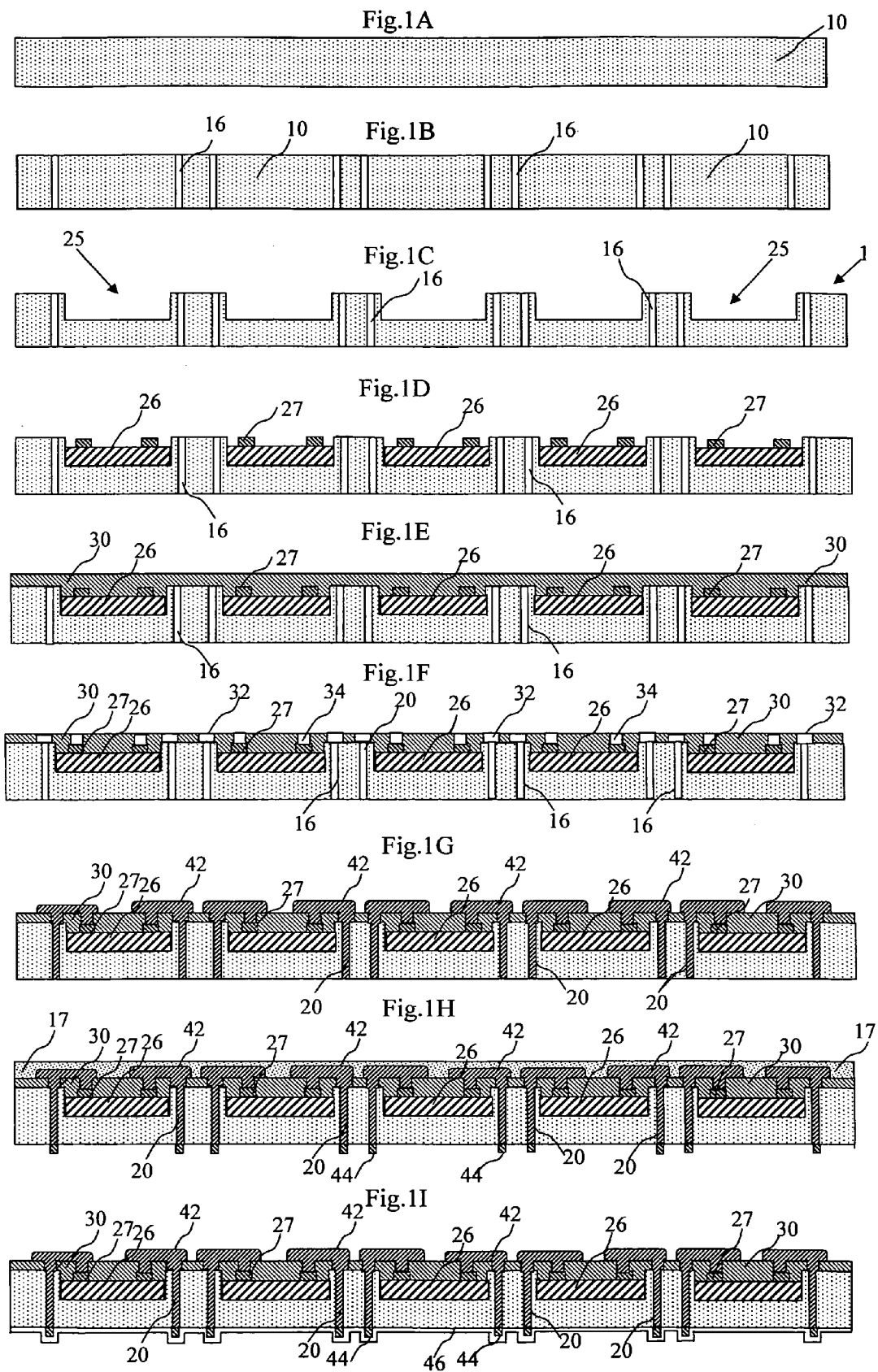
FIG. 1A-FIG. 1I are schematic views illustrating production steps in a semiconductor element built-in type circuit board according to an embodiment of the invention.

A preferable embodiment of the semiconductor element built-in type multilayered circuit board according to the invention will be described below. This board is constructed by integrally piling a plurality of semiconductor element built-in type boards having substantially the same structure in which a recess is formed in an insulating substrate and a semiconductor element such as IC chip or the like is accommodated and implanted in the recess.

One of constructional features in the invention lies in the use of the semiconductor element built-in type board having a linear expansion coefficient difference between the semiconductor element and the insulating substrate being less than $1 \times 10^{-5}$/K (10 ppmK$^{-1}$) in a temperature region of 20-300° C.

Thus, the linear expansion coefficient difference between the semiconductor element and the insulating substrate is made small, which prevents the adhesion inhibition between the insulating substrate and the semiconductor element accommodated in the recess and instability of the semiconductor element in the recess.

Further, the said small difference of linear expansion coefficient improves the quality of the multilayered circuit board by preventing misalignment in the integral lamination of the plural semiconductor element built-in type boards.

Such a construction solves the problems of stress concentration and warping of the substrate during device operation caused by the said linear expansion coefficient difference and also mitigates the problems of stress concentration and warping of the substrate in manufacturing process, whereby the stress is not applied to the semiconductor element, so that the occurrence of crystal defect inside the element or the deterioration of the device characteristics is prevented.

Moreover, when the material of the insulating substrate is a ceramic made from various inorganic materials having a heat conductivity higher than that of a resin or a high heat-conductive ceramic such as aluminum nitride or the like, heat generated from the semiconductor element is effectively dispersed or discharged, whereby the stress concentration or warping of the substrate in the operation of the semiconductor element is effectively prevented and the stable device operation can be ensured.

For example, when a silicon substrate is used as the semiconductor element, the linear expansion coefficient is about $0.46 \times 10^{-5}$/K, while when aluminum oxide is used as the insulating substrate, the linear expansion coefficient is about $0.80 \times 10^{-5}$/K or when aluminum nitride is used, the linear expansion coefficient is about $0.57 \times 10^{-5}$/K. Therefore the difference of the linear expansion coefficient is about $0.34 \times 10^{-5}$/K or $0.11 \times 10^{-5}$/K, which is within a preferable range of less than $1 \times 10^{-5}$/K in the invention.

The insulating substrate used in the multilayered circuit board has a thickness of about 50-1000 µm. When the thickness is within such a range, the strength is sufficient and the handling is easy and the recess accommodating the semiconductor and the fine through-hole are easily formed and also the formation of the connecting path electrically connecting the upper and lower faces of the insulating substrate through the electrically conductive material filled in the through-hole is easy. The thickness of the insulating substrate is preferably 100-800µ, more preferably about 200-500 µm.

The insulating substrate is provided with a recess(s) accommodating the semiconductor element for the formation of the semiconductor element built-in type board. One or more recesses are formed in the insulating substrate in accordance with the size of the semiconductor element accommodated in the recess. In this case, the thickness of the substrate bottom having the recess is 10-250 µm. Because, such a thickness is required and is very efficient for thermal-transmitting heat generated from the semiconductor element to a surrounding thereof to promote the heat diffusion, and it is ideally thin for its miniaturization.

The insulating substrate is preferably at least one inorganic material selected from an oxide ceramic, a carbide ceramic, a silicide ceramic, a boride ceramic, a nitride ceramic and a low-temperature calcined ceramic (LTCC), or a high heat-conductive ceramic such as aluminum nitride or the like. With the heat conductivity larger than that of resin substrates and the heat dispersing property better than that of resin substrates, these materials can accommodate each semiconductor element close to the recess of the insulating substrate, effectively and rapidly diffuse heat generated from the semiconductor element through the insulating substrate over a whole of the substrate and discharge (disperse) toward the exterior, and attain the stabilization of the element characteristics by decreasing operating temperature of the semiconductor element.

Moreover, the high heat-conductive ceramic is a ceramic with its heat conductivity equal to or more than 100 W/(m·K), preferably 150-400 W/(m·K). As the heat conductivity of aluminum nitride as a preferable example of the high heat-conductive ceramic is larger than that of the other oxide ceramics, and is particularly larger than that of resin, aluminum nitride is good in the heat conducting properties, and can be preferably used with its the thermal expansion coefficient close to that of the semiconductor element. A composite material of ceramic and metal can also be used as a material having large heat conductivity.

The insulating substrate is preferably a material formed by laminating a frame plate having an opening portion and a flat plate, a flat plate with its face processed to cutting work, or a ceramic sintered body formed by firing a body with recess formed in advance, or the like.

The semiconductor element can be a silicon substrate (linear expansion coefficient=$0.46 \times 10^{-5}$/K) or various compound semiconductor substrates. The compound semiconductor substrate other than silicon substrate can be, for example, a gallium-arsenic compound substrate ($0.64 \times 10^{-5}$), a gallium-phosphorus compound substrate ($0.53 \times 10^{-5}$/K), a gallium nitride compound substrate ($0.56 \times 10^{-5}$/K), or a silicon carbide substrate ($0.47 \times 10^{-5}$/K) or the like.

The semiconductor element built-in type board constituting the multilayered circuit board comprises an insulating substrate provided with at least one recess accommodating a semiconductor element and at least one or more than one through-hole formed in a surrounding portion of the recess, a connecting path electrically connecting upper and lower faces of the insulating substrate with an electrically conducting material inside the through-hole (hereinafter referred to as a connecting path simply), a semiconductor element accommodated in the recess and having on its upper face at least one electrode pad, an insulating layer covering the surfaces of the semiconductor element and the insulating substrate and having portions of the opening to the connecting path and to the upper side of electrode pad, and a conductor wiring formed on the surface of the insulating layer and connecting the connecting path to the electrode pad.

When the plurality of the semiconductor element built-in type boards are laminated and integrally united with each other, the laminated semiconductor element built-in type boards are electrically connected to each other through an electrical conductive bump arranged at a lower face side of each of the connecting paths.

The construction of the semiconductor element built-in type board will be described in detail below.

The recess is formed, for example, at almost a central portion of the semiconductor element built-in type board, i.e. in a region accommodating the semiconductor element, and a plurality of fine through-holes are formed in a surrounding portion directing outward from the semiconductor element accommodated in the region, and an electrically conductive substance is placed in the each through-hole by plating or the like to form a connecting path electrically connecting the upper and lower faces of the insulating substrate to each other.

The connecting path and the semiconductor element are electrically connected to each other by forming a conductor wiring between at least one electrode pad formed on the semiconductor element and the connecting path. The conductor wiring covers the semiconductor element and the surface of the insulating substrate and is formed along the surface of the insulating layer having the opening portion formed at the position corresponding to the connecting path and the electrode pad. This conductor wiring enables the electrical connection in the semiconductor element built-in type board.

On the other hand, the laminated semiconductor element built-in type boards are electrically connected to each other by directly contacting a connecting pad formed on the connecting path in the insulating substrate of the respective board or the conductor wiring connected to the connecting path with the electrically conductive bump formed on the lower face side of the connecting path of the board to be laminated on the upper part of the above board, whereby a multilayered circuit board is obtained.

That is, such a semiconductor element built-in type board is laminated with the other semiconductor element built-in type board having substantially the same structure and integrally united through an adhesive, if necessary, to form a multilayered circuit board having a high density and high performances.

In the laminated and integrally united multilayered circuit board, the semiconductor element of the semiconductor element built-in type board connected to the exterior through the other semiconductor element built-in type board is connected to the conductor wiring and the connecting path corresponding thereto and directly connected to the conductor wiring or the connecting pad of the other laminated semiconductor element built-in type board through the electrically conductive bumps, so that the inconveniences due to the shortening of the distance between the semiconductor chips, wiring resistance or inductance are reduced, and hence the transmission of electric signals can be conducted at a high speed without delaying.

When the diameter of the through-hole in the connecting path is about 10-200 μm, the electrically conductive substance is easily existent in the through-hole, and the high connection reliability as well as the high densification can also be easily obtained.

The connecting path is formed by plating the through-hole previously formed in the insulating substrate with the electrical conductive substance or by inserting a W—Mo plug thereinto or by filling the electrical conductive paste therein. Moreover, an electroless plating is desirable as the plating treatment.

In the plating treatment, Sn, Pb, Ag, Au, Cu, Zn, In, Bi, a solder, a tin alloy or the like is used, but a copper plating is particularly preferable.

A plated film can also be formed in a part of the through-hole by the electroless plating and then the electrical conductive paste can be filled in the remaining portion.

The electrical conductive paste can be made from one or more of metal particles selected from silver, copper, gold, nickel and various solders.

The metal particles can be the surfaces of the metal particles coated with other kind of metal. For example, metal particles can be the surfaces of copper particles coated with a noble metal such as gold or silver.

Moreover, an organic electrical conductive paste obtained by adding a thermosetting resin such as epoxy resin or the like or a polyphenylene sulfide resin (PPS) to the metal particles is preferable as the electrical conductive paste.

The through-hole for forming the connecting path is preferably formed by subjecting the sintered ceramic to a laser work, but is not limited thereto. It can also be formed by drilling or formed by punching and sintering a green sheet. As a laser beam, a YAG laser, an excimer laser or the like is desirable.

The connecting path is formed in the surrounding portion apart from the central portion of the insulating substrate, while the recess for accommodating the semiconductor element is formed in the central portion of the insulating substrate. The recess is formed in accordance with the size and thickness of the semiconductor element. It is preferable that the semiconductor element is accommodated in the recess and fixed with a suitable adhesive, if necessary.

Also, it is preferable that the semiconductor element accommodated in the recess of the insulating substrate is fixed so as to render the surface of the electrode pad and the surface of the insulating substrate into substantially flat alignment, for example, so as to make the height difference between them equal to or less than 10 μm. By keeping such alignment, the wiring layer electrically connecting the electrode pad of the semiconductor element to the connecting path is made flat, which enables the high densification of the wiring circuit or the shortening of the distance between the semiconductor elements. Further, the depth of the opening in the insulating layer covering the surface of the insulating substrate and the surface of the semiconductor element can be made constant at positions corresponding to the connecting path and the electrode pad, so that the conditions in the light exposure and the laser working for forming the openings can be easily set.

It is preferable that the semiconductor element is fixed to at least the bottom of the recess in the insulating substrate with an adhesive such as epoxy-based silver paste or the like or fixed to the inner wall of the recess with the adhesive by interposing an eutectic alloy between the semiconductor element and the inner wall material of the insulating substrate.

The insulating layer covering the surface of the insulating substrate and the surface of the semiconductor element is most preferably a resin insulating layer such as a thermosetting resin, a thermoplastic resin or a composite of the thermosetting resin and the thermoplastic resin.

The resin insulating layer is preferably made from a resin film softening under predetermined heating conditions, for example, a resin film composed mainly of a thermosetting polyolefin resin or an epoxy resin. Cycloolefin resin can be used as one of the polyolefin resin. The cycloolefin resin is low in the dielectric constant and dielectric tangent, hardly generates the propagation delay or error of signals even in case of using a high frequency signal of GHz zone, and is also excellent in the mechanical properties such as rigidity and the like.

The cycloolefin resin is preferably 2-norbornene, 5-ethyliden-2 norbornene, a homopolymer or a copolymer of such dielectric bodies.

One example of the dielectric bodies is cycloolefin such as 2-norbornene bind with amino acid residue or maleic acid for crosslinking formation.

The examples of the monomer for the synthesis of the copolymer are ethylene, propylene and the like. Particularly, a thermosetting cycloolefin resin is preferable because the rigidity is increased and the mechanical characteristics are improved by the crosslinking formation under heating.

In a preferable embodiment, the resin film consisting essentially of such a polyolefin resin is formed by heat pressing under conditions that the temperature is 50-250° C. and a pressure is $9.8 \times 10^4$-$4.9 \times 10^6$ Pa and a pressing time is 1-120 minutes.

A conductor wiring for electrically connecting the electrode pad of the semiconductor element to the connecting path formed in insulating substrate is arranged on the surface of the insulating layer, while the openings are formed in the insulating layer at positions corresponding to the connecting path and the electrode pad, and the connecting path and the electrode pad are electrically connected to the conductor wiring through the openings.

The opening is preferably formed at an opening diameter corresponding to the electrode pad and the connecting path. Also, the opening is formed by light exposure and developing treatment when the insulating layer is made from a photosensitive resin or by laser irradiation when the insulating layer is made from the thermosetting resin or thermoplastic resin. In the latter case, a carbon dioxide gas laser, a ultraviolet ray laser, an excimer laser or the like is preferable as the laser beam.

After the opening is formed in the insulating layer, the adhesion to the conductor wiring formed on the insulating layer may be improved by roughening its surface, if necessary.

When the connecting path or the conductor wiring is formed by the electroless plating, a catalyst nucleus for the electroless plating is applied on the interior of the through-hole or the surface of the insulating layer. In general, the catalyst nucleus is a palladium-tin colloid solution or the like, and the catalyst nucleus is fixed to the substrate in this solution by immersion, drying and heating. Also, the catalyst nucleus is formed in the insulating layer by striking a metal nucleus to the surface of the insulating layer through CVD, sputtering, plasma or the like. In the latter case, the metal nucleus is embedded in the surface of the insulating layer and the plated mass is precipitated around the metal nucleus to form the conductor wiring, so that even if a resin having a poor adhesion to the conductor wiring such as a hardly roughening resin or a fluorine resin (polytetrafluoroethylene or the like) is used as the insulating layer, the adhesion property can be ensured. The metal nucleus is preferably chosen from at least one or more than one of palladium, silver, gold, platinum, titanium, copper and nickel. Moreover, the amount of the metal nucleus is preferably equal to or less than 20 $\mu g/cm^2$.

A thinned conductor layer is formed in the through-hole provided with the catalyst nucleus for the electroless plating and on the surface of the electrode pad and the surface of the insulating layer by the electroless plating treatment. The formation of the thinned conductor layer is preferably an electroless copper plating. After a photosensitive dry film is laminated on the thinned conductor, a plating resist is formed by light exposure and developing treatment, and further plating treatment is carried out to thicken the conductor layer portion, while each of the opening corresponding to the connecting path and corresponding to the electrode pad of the semiconductor element is filled with the plated mass, respectively. The plated mass is preferably formed by electrolytic copper plating, and the thickness thereof is preferably 5-30 $\mu m$. After the plating resist is peeled off, the thinned conductor layer located below the plating resist is dissolved out and removed by an etching treatment using an aqueous solution of sulfuric acid-hydrogen peroxide, an aqueous solution of a persulfate such as ammonium persulfate, sodium persulfate, potassium persulfate, or an aqueous solution of ferric chloride or copper chloride as an etching solution, whereby a conductor wiring electrically connecting an electrode pad of a memory IC to a connecting path pad is formed along the surface of the insulating layer.

The thinned conductor layer can also be formed on the surface of the insulating layer by sputtering.

The conductor wiring is constituted with a pattern of fine line width extended from the electrode pad of the semiconductor element fixed at almost the central portion of the substrate toward an outer peripheral portion and preferably has a thickness of 5-30 $\mu m$, most preferably 12 $\mu m$. Also, a ratio of line width to distance between lines (L/D) is desirable to be 10 $\mu m$/10 $\mu m$-50 $\mu m$/50 $\mu m$. Furthermore, the pad formed on the wiring pattern preferably has an opening diameter of 15-300 $\mu m$, particularly 100 $\mu m$.

The electric conductive bump for electrically connecting the laminated semiconductor element built-in type boards to each other is preferably formed by the plating treatment or the printing of an electrically conductive paste. The filling by the plating treatment can be conducted by either electrolytic plating or electroless plating, but the electrolytic plating is desirable. For the electrolytic plating, for example, Sn, Pb, Ag, Au, Cu, Zn, In, Bi, solder, tin alloy and the like can be used, but the electrolytic tin plating is most effective in this embodiment.

The electric conductive bump preferably has a height of 3-30 $\mu m$. Because if the bump has such a height, the scattering of the bump due to the deformation of the bump can be allowed and also there is no increase of migration or formation of whisker. Particularly, it is more preferable if the height of the electric conductive bump is about 5 $\mu m$. The electric conductive bump can also be formed by printing an electrically conducting paste on a lower face side of the connecting path through a screen printing with a metal mask instead of the plating treatment. The bump made of the electrically conducting paste is preferably at a semi-cured state. Because the electrically conducting paste is hard even at the semi-cured state and it can penetrate in an organic adhesive layer softened in hot pressing. Furthermore, the electrically conducting paste is deformed in the hot pressing to increase the contact area, whereby the conducting resistance can be lowered but also the variation of the bump height can be corrected.

In addition, the electrically conducting bump can be formed by a method of printing a solder paste of a low melting point metal, a method of conducting a solder plating or a method of immersing in a solder fused liquid. As the low melting point metal, Pb—Sn solder, Ag—Sn solder, indium solder and the like can be used.

It is desirable that an adhesive layer adhering the semiconductor element built-in type boards to each other is formed on any surface of the semiconductor element built-in type board. The adhesive layer is preferably at the uncured state by applying a resin onto any surface of the semiconductor element built-in type board and then drying.

The adhesive layer is preferably made from an organic adhesive. As the organic adhesive is preferably chosen from at least one or more than one of an epoxy resin, a polyimide resin, a thermosetting polyphenylene ether (PPE: polyphenylene ether), a mixed resin of an epoxy resin and a thermoplastic resin, a mixed resin of an epoxy resin and a silicone resin and BT resin.

A solvent for the organic adhesive can be NMP, DMF, acetone or ethanol.

As a method of applying an uncured resin as the organic adhesive, a curtain coater, a spin coater, a roll coater, a spray coater, a screen printing and the like can be applied.

The adhesive layer desirably has a thickness of 5-50 μm. The adhesive layer is preferably subjected to a preliminary curing (pre-cure) for easy handling.

As a combination way for laminating an d integrally uniting a plurality of semiconductor element built-in type boards, it is desirable that a board accommodating an element of a large heat-generating amount, e.g. a semiconductor element mainly having a processing function (logic IC) is arranged at a surface layer side, while a board accommodating an element of a relatively small heat-generating amount, e.g. a semiconductor element mainly having a memory function (memory IC) is arranged at an inner layer side, and that these boards are laminated one upon the other in the same direction and integrally united with each other.

The multilayered circuit board can also be produced by laminating a plurality of semiconductor element built-in type boards accommodating a semiconductor element mainly having a memory function (memory IC) in the same direction, uniting them integrally, forming a part of conductor wiring at the outermost board of the resulting multilayered circuit board into a pad and flip-mounting a semiconductor element mainly having a processing function (logic IC) on the pad through a solder bump.

The lamination of the boards is carried out by optically detecting a mark for position previously formed in each of the boards with a CCD camera or the like and then positioning these boards. Such a laminated body is pressed under a pressure of 0.5-5 MPa while heated at a temperature of 50-250° C., whereby all of the circuit boards can be integrally united through press shaping at once. The preferable heating temperature is 160-200° C.

Other electronic parts than the semiconductor element can also be mounted on the pad of the conductor wiring in the circuit board located at the outer surface of the multilayered circuit board.

At the outermost circuit board of the multilayered circuit board, a conductor wiring inclusive of a pad is formed, so that a nickel-gold layer, for example, can be formed on the pad of the conductor wiring and solder balls or pins can be joined on the gold-nickel layer to form a connection terminal for a mother board.

From the next paragraph, the semiconductor element built-in type multilayered circuit board according to the invention will be concretely described with reference to the following examples. Although four semiconductor element built-in type boards are sequentially laminated to form a four multilayered circuit board in these examples, the invention is not intended as limitation to the examples, and can be applied to the production of the multilayered circuit board of 3 or less than 3 layers or of 5 or more than 5 layers in accordance with the characteristics, such as capacity and thickness of the semiconductor element to be mounted, or such as thickness and the kinds of the insulating substrates.

Example 1

In Example 1, the characteristics of the semiconductor element built-in type multilayered circuit board are examined when aluminum oxide is used as an insulating substrate.

At first, the semiconductor element built-in type multilayered circuit board according to the invention is manufactured according to the following steps (1)-(15). The characteristics are shown in Table 1.

(1) A green sheet 10 of aluminum oxide is obtained by using a doctor blade process (see FIG. 1A).

(2) The green sheet 10 is dried at 80° C. for 5 hours, degreased at 600° C. for 5 hours and hot-pressed at 1400° C. under a pressure of 150 kg/cm$^2$ for 3 hours and plate-shaped aluminum oxide sintered body is obtained. A disc having a thickness of 0.4 mm and a diameter of 230 mm is cut out from the plate-shaped sintered body and through-holes 16 of 30 μm in diameter are formed by using UV-YAG laser, which makes an insulating substrate 1 (see FIG. 1B).

Moreover, the thus obtained insulating substrate has a linear expansion coefficient of $8.0 \times 10^{-6}$/K as measured within a range of 20-300° C.

(3) On the surface of the insulating substrate 1 obtained in the step (2) are formed recesses 25 for accommodating semiconductor elements by using YAG laser (see FIG. 1C). Hereinafter the surface of the insulating substrate 1 with recesses formed therein is referred to as the first surface.

(4) An adhesive (epoxy-based silver paste: SA-2024, made by Fujikura Kasei Co., Ltd.) (not shown) is applied to inner walls of the recesses 25 obtained in the step (3), and a semiconductor elements 26 shaped into chips of 10 mm square through dicing (silicon substrate: linear expansion coefficient at 25-450° C. of $4.6 \times 10^{-6}$/K) are fitted there into at this state, which are subjected to a heating treatment in a nitrogen atmosphere at 170° C. for 15 minutes to dry and cure the adhesive, whereby the semiconductor elements 26 are adhered and fixed to the inner wall of the recesses 25. In this case, the semiconductor elements 26 are fixed so that surfaces of electrode pads 27 are substantially flat in alignment with the first surface of the insulating substrate 1 (see FIG. 1D).

Moreover, the adhesion and fixation of the semiconductor elements 26 to the recesses 25 of the substrate in the step (4) can be carried out with Au—Si eutectic alloy. In this case, Au is deposited on the inner wall of the recesses 25 at a thickness of 1-10 μm through metal masks of stainless steel provided with openings corresponding to the positions of the recesses 25 in the step (3). Then, the semiconductor elements 26 shaped into a chip through dicing (silicon substrates: linear expansion coefficient at 25-450° C. of $4.6 \times 10^{-6}$/K) are fitted into the Au deposited film and subjected to a heating treatment in a nitrogen atmosphere at 400° C. for 10 minutes to form an eutectic of Au and Si between the Au film deposited on the inner wall of the recesses 25 and the semiconductor elements 26, whereby the semiconductor elements 26 can be adhered and fixed to the inner wall of the recesses 25.

(5) Next, a thermosetting polyolefin resin sheet of 20 μm in thickness as a resin film softening under a given heating condition is laminated on the first surface of the insulating substrate 1 accommodating the semiconductor elements 26 by hot pressing under a pressure of $9.8 \times 10^3$ Pa while raising the temperature up to 50-180° C. to obtain a resin insulating layer 30 made of the polyolefin resin (see FIG. 1E).

(6) A carbon dioxide gas laser is applied on the surface side of the resin insulating layer 30 made of the polyolefin resin to form openings 32 reaching the through-holes 16 and openings 34 reaching the electrode pads 27 of the semiconductor elements 26 on it (see FIG. 1F).

(7) Further, the desmear and the surface modification of the polyolefin resin insulating layer are carried out by a plasma treatment with a mixed gas of $CF_4$ and oxygen. By this modification, the presence of hydrophilic groups such as OH group, carbonyl group, COOH group and the like is confirmed on the surface of the insulating layer.

(8) Then, the board is immersed in a solution of palladium-tin colloid to give a catalyst nucleus for electroless plating to the surface of the resin insulating layer 30 of the polyolefin resin formed in the step (7), the through-holes 16 for connecting paths, inner wall surfaces of the openings 32 and 34.

Thereafter, it is immersed in an electroless copper plating solution to form an electroless copper plated layer.

(9) A plating resist of 30 μm in thickness (not shown) is formed on the electroless copper plated layer formed in the step (8) by using a photosensitive dry film.

(10) Further, it is subjected to an electrolytic copper plating to form an electrolytic copper plated layer of 12 μm in thickness, whereby a conductor layer forming a connection wiring pattern 42 is formed and also the plated layer is filled in the through-holes 16 for connecting paths, the openings 32 and 34.

(11) Then, the plating resist formed in the step (9) is peeled off and removed, and thereafter the electroless copper plated portion located below the resist is dissolved out and removed to form a wiring pattern 42 composed of the electrolytic copper plated portion and the electroless copper plated portion. The wiring pattern 42 electrically connects the electrode pads 27 of the semiconductor elements 26 to connecting paths 20 (see FIG. 1G).

(12) Further, it is subjected to an electrolytic tin plating treatment with a commercially available tin plating solution to form electric conductive bumps 44 having a diameter of 30 μm and a height of 5 μm on the connecting paths 20 at a surface of the insulating substrate 1 opposite to the first surface (hereinafter referred to as the second surface). In this case, a PET film 17 is previously attached to the first surface of the insulating substrate 1 (see FIG. 1H).

(13) An adhesive of an epoxy resin is applied to the second surface of the insulating substrate 1 provided with the electric conductive bumps 44 formed in the item (12) and dried to form an adhesive layer 46 (see FIG. 1I). Moreover, the adhesive layer 46 is previously formed on the second surface of the insulating substrate 1 in this example, but the adhesive layer of a dried and uncured resin can be formed when applying an adhesive to proper places at a stage of laminating circuit boards with each other.

(14) The insulating substrate 1 formed in the step (13) is cut and divided into a square of 20 mm by each semiconductor element with a dicing saw to manufacture an individual semiconductor element built-in type circuit board.

Figure 2:
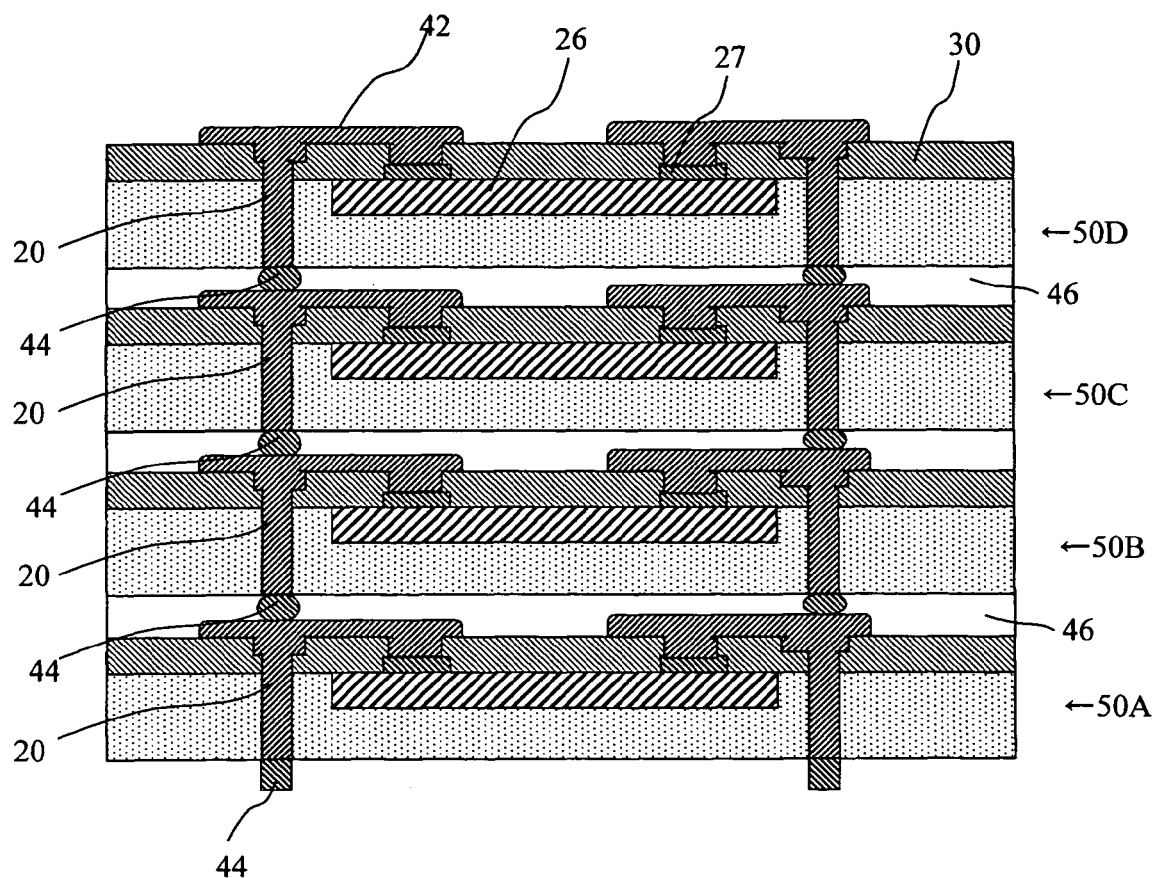
FIG. 2 is a schematic view of a semiconductor element built-in type multilayered circuit board according to an embodiment of the invention.

(15) Then, three semiconductor element built-in type boards 50B, 50C, 50D prepared according to the above steps (1)-(14), and a semiconductor element built-in type circuit board 50A, which is obtained by cutting and dividing the semiconductor element built-in type board prepared according to the steps (1)-(11) without electric conductive bumps or adhesive with the dicing saw in the same manner as the step (14), are laminated in the same direction to locate the semiconductor element built-in type board 50A without electric conductive bumps or adhesive at a position of lowermost layer, heated at a temperature of 180° C. and pressed under a pressure of 2 MPa to cure the adhesive layer formed in each circuit board, whereby these semiconductor element built-in type boards 50A-50D are strongly adhered and integrally united. Moreover, a hot press under vacuum is applied for hot pressing (see FIG. 2).

(16) After PET film as a protection film is attached to the surface of the uppermost board 50D among the integrally united circuit boards, the treatment according to the step (12) is carried out to form an electric conductive bumps 44 on the connecting paths 20 of the undermost board 50A, whereby a multilayered circuit board is manufactured.

Each semiconductor element of the thus obtained semiconductor element built-in type multilayered circuit board is worked under an average loading condition (5 W/h) to examine the working state. As a result, it has been confirmed that each semiconductor element works well without raising the temperature to an extent of causing troubles.

Example 2

In this example, the semiconductor element built-in type multilayered circuit board is manufactured in the same manner as in Example 1 except that LTCC is used as an insulating substrate. The characteristics are shown in Table 1.

As the thus obtained semiconductor element built-in type multilayered circuit board is worked under an average loading condition (5 W/h) in the same manner as in Example 1, it has been confirmed that the element works well without causing troubles though the temperature of the semiconductor element becomes higher than that of Example 1.

Examples 3 and 4

In these examples, the semiconductor element built-in type multilayered circuit boards are manufactured in the same manner as in Example 1 except that the thickness of the insulating substrate and the thickness of the recess are changed. The characteristics are shown in Table 1.

As the thus obtained semiconductor element built-in type multilayered circuit boards are worked under an average loading condition (5 W/h) in the same manner as in Example 1, it has been confirmed that the elements work well.

Example 5

In this example, the semiconductor element built-in type multilayered circuit board is manufactured in the same manner as in Example 1 except that the steps (2)-(3) are changed into the following steps (A)-(C) and the steps (7)-(9) are changed into the following steps (D)-(G). The characteristics are shown in Table 1.

(A) The green sheet 10 is dried at 80° C. for 5 hours and subjected to a laser work to form through-holes 16 for connecting paths.

(B) Then, tungsten-molybdenum plugs of 20 μm in diameter are filled in the through-holes 16 prepared in the step (A) to form connecting paths 20.

(C) The sheet is degreased at 600° C. for 5 hours and then hot-pressed at 1400° C. under a pressure of 150 kg for 3 hours. Thereafter, it is cut out into a disc of 0.5 mm in thickness and 230 mm in diameter to provide an insulating substrate 1.

(D) Further, a sputtering with copper as a target is applied, whereby a copper sputter layer of 0.1 μm in thickness as a conductor foundation layer is formed on the surface of the resin insulating layer 30 made from the polyolefin resin and inner wall surfaces of the openings 32 and 34 formed in the step (9).

(E) By using a photosensitive dry film, a plating resist of 15 µm in thickness is formed on the copper sputter layer formed in the step (D).

(F) Further, an electrolytic copper plating is applied to form an electrolytic copper plated layer of 15 µm in thickness, whereby the conductor layer forming a connection wiring pattern 42 is thickened and the openings 32 and 34 are filled with the plated layer.

(G) Then, the plating resist formed in the step (E) is peeled off and removed, and thereafter the copper sputter layer and electrolytic copper plated layer located below the plating resist are dissolved out and removed to form a wiring pattern 42 composed of the electrolytic copper plated layer and copper sputter layer. Thus, the electrode pads 27 of the semiconductor elements 26 are electrically connected to the connecting paths 20.

Each semiconductor element of the thus obtained semiconductor element built-in type multilayered circuit board is worked under an average loading condition (5 W/h) to examine the working state. As a result, it has been confirmed that each semiconductor element works well without raising the temperature to an extent of causing troubles.

TABLE 1

| No | Kind | Purity % | Density cm³ | Thermal expansion coefficient ×10⁻⁵/K | Heat conductivity W/(m/K) | Thickness mm | Semiconductor element[1] Thermal expansion coefficient ×10⁻⁵/K | Difference in thermal expansion coefficient between insulating substrate and semiconductor element ×10⁻⁵/K |
|---|---|---|---|---|---|---|---|---|
| Example 1 | Aluminum Oxide | 99.5 | 3.9 | 0.80 | 35 | 0.40 | 0.46 | 0.34 |
| Example 2 | LTCC | — | 2.8 | 0.55 | 3 | 0.40 | 0.46 | 0.09 |
| Example 3 | Aluminum Oxide | 99.5 | 3.9 | 0.80 | 35 | 0.75 | 0.46 | 0.34 |
| Example 4 | Aluminum Oxide | 99.5 | 3.9 | 0.80 | 35 | 0.27 | 0.46 | 0.34 |
| Example 5 | Aluminum Oxide | 99.5 | 3.9 | 0.80 | 35 | 0.50 | 0.46 | 0.34 |

| No | Thickness of recess µm | Adhesive | Height difference µm | Electric conductive bump | Connecting path | Working of multilayered circuit board |
|---|---|---|---|---|---|---|
| Example 1 | 150 | Epoxy-based silver paste | 5.0 | Electrolytic tin plating | Cu Plating | Good |
| Example 2 | 148 | Electrolytic tin plating | 3.0 | Electrolytic tin plating | Cu Plating | Good |
| Example 3 | 500 | Epoxy-based silver paste | 5.0 | Electrolytic tin plating | Cu Plating | Good |
| Example 4 | 20 | Epoxy-based silver paste | 5.0 | Electrolytic tin plating | Cu Plating | Good |
| Example 5 | 150 | Epoxy-based silver paste | 5.0 | Electrolytic tin plating | W—Mo | Good |

[1] Silicon

In the following Examples 6-10, the characteristics of the semiconductor element built-in type multilayered circuit board are examined when a high heat conductive aluminum nitride ceramic is used as an insulating substrate.

Example 6

A semiconductor element built-in type multilayered circuit board is manufactured in the same manner as in Example 1 except that the steps (1), (2) in Example 1 are changed into the following steps (H) and (I). The characteristics are shown in Table 2.

(H) A green sheet 10 is obtained by shaping a mixture of aluminum nitride powder (made by TOKUYAMA Co., Ltd., average particle size: 1.1 μm): 100 parts by mass, yttria (average particle size: 0.4 μm): 4 parts by mass, sucrose: 0.2 part by mass and 1-butanol and ethanol: 53 parts by mass in total through a doctor blade process.

(I) The green sheet 10 is dried at 80° C. for 5 hours, degreased at 600° C. for 5 hours and then hot-pressed at 1890° C. under a pressure of 150 kg/cm² for 3 hours to obtain an aluminum nitride plate body. The plate body is cut into a disc of 0.5 mm in thickness and 230 mm in diameter to provide an insulating substrate 1 made of aluminum nitride. Moreover, the thus obtained insulating substrate 1 has a linear expansion coefficient of $5.7 \times 10^{-6}$/K as measured within a range of 20-300° C.

Then, a multilayered circuit board is obtained by laminating four semiconductor element built-in type boards in the same manner as in the steps (3)-(14) of Example 1. Each semiconductor element of the semiconductor element built-in type multilayered circuit board is worked under an average loading condition (5 W/h) to measure a temperature of a semiconductor element located at an outermost side (50D). The temperature of the each semiconductor element during the working is shown in Table 3, from which it is confirmed that with the temperature difference between the outermost semiconductor element (50D) and the innermost semiconductor element (50A) being small, the obtained semiconductor element built-in type multilayered circuit board is excellent in the heat dispersion property and works well.

Example 7

A semiconductor element built-in type multilayered circuit board is manufactured in the same manner as in Example 6 except that the step (4) of Example 1 is changed into the following step (J). The characteristics are shown in Table 2.

(J) Au is deposited on the inner wall of the recesses 25 at a thickness of 1-10 μm through a metal mask of stainless steel provided with openings corresponding to the positions of the recesses 25. Then, the semiconductor elements 26 shaped into a chips through dicing (silicon substrate: linear expansion coefficient at 25-450° C. of $4.6 \times 10^{-6}$/K) are fitted into the Au deposited film and subjected to a heating treatment in a nitrogen atmosphere at 400° C. for 10 minutes to form an eutectic of Au and Si between the Au film deposited on the inner wall of the recesses 25 and the semiconductor elements 26, whereby the semiconductor elements 26 are adhered and fixed to the inner wall of the recesses 25. In this case, the semiconductor elements 26 are fixed so that the surface of the electrode pads 27 is substantially flat in alignment with the first surface of the insulating substrate 1.

With respect to the thus obtained semiconductor element built-in type multilayered circuit board, a surface temperature just above the outermost semiconductor element (50D) and a temperature of the innermost semiconductor element (50A) are measured in the same manner as in Example 6 to obtain results shown in Table 3.

It has been confirmed that with the temperature difference between the outermost semiconductor element (50D) and the innermost semiconductor element (50A) the semiconductor element built-in type multilayered circuit board being small the obtained semiconductor element built-in type multilayered circuit board is excellent in the heat dispersion property and works well.

Example 8

A semiconductor element built-in type multilayered circuit board is manufactured in the same manner as in Example 6 except that the step (12) of Example 1 is changed into the following step (K). The characteristics are shown in Table 2.

(K) Electric conductive bumps 44 having a diameter of 80 μm and a height of 30 μm are formed on the connecting paths 20 at a surface of the insulating substrate 1 opposite to the first surface (hereinafter referred to as the second surface) by printing an electrically conductive paste of tin-silver solder as a low melting point metal.

With respect to the thus obtained semiconductor element built-in type multilayered circuit board, a surface temperature just above the outermost semiconductor element (50D) and a temperature of the innermost semiconductor element (50A) are measured in the same manner as in Example 6 to obtain results shown in Table 3.

In this example, since the electric conductive bumps 44 are formed by a printing process, it has been confirmed that the multilayered circuit board having the same heat dispersion property as in Example 5 can be manufactured at a low cost.

Example 9 and 10

In these examples, semiconductor element built-in type multilayered circuit boards are manufactured in the same manner as in Example 6 except that aluminum nitride sintered bodies having different linear expansion coefficients, heat conductivites, thicknesses or recess thicknesses from those of the manufactured board in Example 6 are used as the insulating substrate. The characteristics are shown in Table 2.

With respect to the thus obtained semiconductor element built-in type multilayered circuit boards, a surface temperature just above the outermost semiconductor elements (50D) and a temperature of the innermost semiconductor elements (50A) are measured in the same manner as in Example 6 to obtain results shown in Table 3.

It has been confirmed that the semiconductor element built-in type multilayered circuit boards work well though the temperature difference between the outermost semiconductor elements (50D) and the innermost semiconductor elements (50A) is large.

Reference Example

A semiconductor element built-in type multilayered circuit board is manufactured in the same manner as in Example 6 except that a height difference between the surfaces of the electrode pads 27 of the semiconductor elements 26 and the surfaces of the through-hole pads 40 of the insulating substrate 1 is changed. The characteristics are shown in Table 2.

It has been confirmed that the semiconductor element built-in type multilayered circuit board failed to work due to the ill wiring conductivity caused by the large hight difference (larger than 10 μm) between the surfaces of semiconductor elements 26 accommodated in the recesses 25 of the insulating substrate 1 and the surfaces of the through-hole pads 40 of the insulating substrate 1.

Comparative Example A semiconductor element built-in type multilayered circuit board is manufactured according to the following steps (1)-(16) by using a glass-epoxy resin composite material having a linear expansion coefficient in a surface direction of $15\times10^{-5}$/K as an insulating substrate 1.

(1) The substrate is a single-sided copper-clad laminate obtained by hot-pressing a copper foil and a prepreg of B-stage formed by impregnating an epoxy resin into a glass cloth. The insulating resin substrate has a thickness of 500 μm and the copper foil has a thickness of 18 μm.

(2) A PET film of 22 μm in thickness is attached to a first surface of the insulating substrate at the copper foil side. The PET film is comprised of an adhesive material layer having a thickness of 10 μm and a PET film base having a thickness of 12 μm.

(3) Then, YAG laser is irradiated above the PET film to form openings for the formation of via-holes and thereafter a plasma cleaning is conducted to remove the resin retaining from an inner wall of the opening.

(4) Then, the PET film is peeled off from the first surface of the insulating resin substrate and a PET film is attached to a second surface, and thereafter an electrolytic copper plating is carried out with a commercially available copper plating solution to fill an electrolytic plated layer in the interior of the openings, whereby a connecting paths having a diameter of 50 μm are formed.

(5) After the PET film is peeled off from the second surface of the insulating substrate, an etching resist layer is formed on the surface of the copper foil and portions of the copper foil not forming the etching resist are treated with an etching solution of copper chloride to form a through-hole pad having a diameter of 100 μm at a position corresponding to the connecting path.

(6) At almost a central portion of the insulating substrate, a recess having a size slightly larger than that of a semiconductor element is formed by using the same laser working device as in the step (3), and an adhesive made of an epoxy resin is applied to an inner wall of the recess and a semiconductor element is fitted into the recess and adhered and fixed to the inner wall of the recess. In this case, the semiconductor element is fixed so that the surface of the electrode pad is substantially flat in alignment with the first surface of the insulating substrate.

(7) Then, a thermosetting polyolefin resin sheet of 50 μm in thickness is laminated on a surface of the insulating substrate forming a through-hole pad by hot pressing under a pressure of $9.8\times10^3$ Pa while raising a temperature up to 50-180° C. to form a resin insulating layer made of the polyolefin resin.

(8) A laser is irradiated from the surface side of the resin insulating layer made of the polyolefin resin to from an opening arriving at the through-hole pad and an opening arriving at the electrode pad of the semiconductor element. Further, the desmear and the surface modification of the polyolefin resin insulating layer are carried out by a plasma treatment with a mixed gas of $CF_4$ and oxygen. By this modification, the presence of hydrophilic groups such as OH group, carbonyl group, COOH group and the like is confirmed on the surface of the insulating layer.

(9) Further, with a sputtering with copper as a target been carried out, a copper sputter layer of 0.1 μm in thickness as a conductor underlayer is formed on the surface of the resin insulating layer made from the polyolefin resin and inner wall surfaces of the openings formed in the step (8).

(10) A plating resist of 15 μm in thickness is formed on the copper sputter layer formed in the step (9) using a photosensitive dry film.

(11) Further, it is subjected to an electrolytic copper plating according to the treatment shown in the step (4) to form an electrolytic copper plated layer of 15 μm in thickness, whereby the conductor layer forming a connection wiring pattern is thickened and the openings are filled with the plated layer.

(12) Then, the plating resist formed in item (10) is peeled off and removed, and thereafter the copper sputter layer and electrolytic copper plated layer located below the plating resist are dissolved out and removed to form a wiring pattern composed of the electrolytic copper plated layer and copper sputter layer. Thus, the electrode pad of the semiconductor element is electrically connected to the connecting path.

(13) Further, with an electrolytic tin plating treatment with a commercially available tin plating solution been carried out, electric conductive bumps having a diameter of 50 μm and a height of 5 μm are formed on the connecting paths. In this case, a PET film is previously attached to the first surface of the insulating substrate.

(14) An adhesive of an epoxy resin is applied to the second surface of the insulating substrate provided with the electric conductive bumps formed in the step (13) and dried to form an adhesive layer.

(15) Then, three semiconductor element built-in type boards prepared according to the above steps (1)-(14), and a semiconductor element built-in type circuit board without electric conductive bumps or adhesives, which is obtained by cutting and dividing the semiconductor element built-in type board prepared according to the steps (1)-(12), are laminated in the same direction so as to locate the semiconductor element built-in type board without electric conductive bumps or adhesives at a position of lowermost layer, heated at a temperature of 180° C. and pressed under a pressure of 2 MPa, whereby these semiconductor element built-in type boards are strongly adhered and integrally united.

(16) After PET film as a protection film is attached to the surface of the uppermost board among the integrally united circuit boards, the treatment according to the step (13) is carried out to form electric conductive bumps on the connecting paths of the undermost board, whereby a multilayered circuit board is manufactured.

As the thus obtained semiconductor element built-in type multilayered circuit board is worked under an average loading condition (5 W/h) in the same manner as in Example 6, the semiconductor element built-in type multilayered circuit board is broken due to excessive temperature rising (over 200° C.) (see Tables 2 and 3).

TABLE 2

| No. | Insulating substrate | | | | | | Semiconductor element*[1] |
|---|---|---|---|---|---|---|---|
| | Kind | Purity % | Density cm³ | Thermal expansion coefficient ×10⁻⁵/K | Heat conductivity W/(m/K) | Thickness mm | Thermal expansion coefficient ×10⁻⁵/K |
| Example 6 | Aluminum nitride | 99.0 | 3.3 | 0.57 | 170 | 0.50 | 0.46 |
| Example 7 | Aluminum nitride | 99.0 | 3.3 | 0.57 | 170 | 0.50 | 0.46 |
| Example 8 | Aluminum nitride | 99.0 | 3.3 | 0.57 | 170 | 0.50 | 0.46 |
| Example 9 | Aluminum nitride | 99.3 | 3.3 | 0.54 | 100 | 0.50 | 0.46 |
| Example 10 | Aluminum nitride | 99.0 | 3.3 | 0.57 | 170 | 0.25 | 0.46 |
| Reference Example | Aluminum nitride | 99.0 | 3.3 | 0.57 | 170 | 0.50 | 0.46 |
| Comparative Example | Glass-epoxy resin composite material | — | — | — | 15 (Plane direction) | 0.50 | 0.46 |

| No. | Difference in thermal expansion coefficient between insulating substrate and semiconductor element ×10⁻⁵/K | Thickness of recess μm | Adhesive | Height difference μm | Electric conductive bump | Connecting path |
|---|---|---|---|---|---|---|
| Example 6 | 0.11 | 250 | Epoxy-based silver paste | 5.0 | Electrolytic tin plating | Cu Plating |
| Example 7 | 0.11 | 250 | Au—Si eutectic | 3.0 | Electrolytic tin plating | Cu Plating |
| Example 8 | 0.11 | 250 | Epoxy-based silver paste | 8.0 | Tin-Silver solder | Cu Plating |
| Example 9 | 0.08 | 250 | Epoxy-based silver paste | 5.0 | Electrolytic tin plating | Cu Plating |
| Example 10 | 0.11 | 10 | Epoxy-based silver paste | 5.0 | Electrolytic tin plating | Cu Plating |
| Reference Example | 0.11 | 250 | Epoxy-based silver paste | 14.3 | Electrolytic tin plating | Cu Plating |
| Comparative Example | 14.5 | 250 | Epoxy-based silver paste | 5.0 | Electrolytic tin plating | Cu Plating |

*[1]Silicon

TABLE 3

| No. | Temperature outermost chip (50D) | Temperature innermost chip (50A) | Working of semiconductor element built-in type multilayered circuit board |
|---|---|---|---|
| Example 6 | 36.7 | 54.2 | Good |
| Example 7 | 36.0 | 53.0 | Good |
| Example 8 | 36.5 | 54.1 | Good |
| Example 9 | 36.9 | 61.4 | Good |
| Example 10 | 56.8 | 114.3 | Good |
| Reference Example | Measurement impossible | Measurement impossible | Not worked due to poor wiring connection |
| Comparative Example | Measurement impossible (76° C. just before breakage) | Measurement impossible (248° C. just before breakage) | Excessive temperature rising (Device breakage over 200° C.) |

The invention can be applied to various electron apparatuses required for high density mounting of many LSI chips or memories, high precision and high reliability such as personal computers, peripheral end devices and the like.

What is claimed is:

1. A semiconductor element built-in type multilayered circuit board comprising: a plurality of boards laminated to form a multilayered structure and comprising a plurality of insulating substrates and a plurality of semiconductor elements, respectively, such that each of the boards has a respective insulating substrate having a recess and a respective semiconductor element accommodated in the recess, each of the insulating substrates comprising a ceramic material, and the recess having an inner wall surface which includes a side wall surface and a bottom surface, wherein a difference between a linear expansion coefficient of the respective insulating substrate and a linear expansion coefficient of the respective semiconductor element in a temperature range of 20-300° C. is less than $1 \times 10^{-5}$ /K, wherein a thickness of each of the insulating substrates at a bottom surface of the recess is 10-250 μm, and the semiconductor element is closely joined, with a conductive adhesive, to the inner wall surface of the recess at a surface of the semiconductor element that does not have any electrode pads thereon; further comprising a plurality of insulating resin layers covering the semiconductor elements and the insulating substrates, respectively, and a plurality of conductor wirings formed over the insulating resin layers, respectively, wherein the plurality of insulating substrates has a plurality of connecting paths, respectively, each of the connecting paths comprises an electrically conducting material and is electrically connecting first and second faces of a respective one of the insulating substrates, the plurality of semiconductor elements has a plurality of electrode pads, respectively, and the conductor wirings extending to the connecting paths and the electrode pads through the insulating resin layers, respectively, and connecting the connecting paths to the electrode pads, respectively.

2. A semiconductor element built-in type multilayered circuit board according to claim 1, further comprising a plurality of electrically conductive bumps connected to the connecting paths, respectively wherein the boards are laminated and electrically connected to each other through the electrically conductive bumps.

3. A semiconductor element built-in type multilayered circuit board according to claim 1, wherein a height difference from a surface of each of the electrode pads to a surface of a respective one of the insulating substrate is within 10 μm.

4. A semiconductor element built-in type multilayered circuit board according to claim 1, wherein the ceramic material comprises at least one ceramic selected from the group consisting of an oxide ceramic, a carbide ceramic, a silicide ceramic, a boride ceramic, a nitride ceramic and a low-temperature fired ceramic (LTCC).

5. The semiconductor element built-in type multilayered circuit board of claim 1, wherein said conductive adhesive comprises epoxy based silver paste.

6. A semiconductor element built-in type multilayered circuit board comprising: a plurality of boards laminated to form a multilayered structure and comprising a plurality of insulating substrates and a plurality of semiconductor elements, respectively, such that each of the boards has a respective insulating substrate having a recess and a respective semiconductor element accommodated in the recess, the recess having an inner wall surface which includes a side wall surface and a bottom surface, wherein the respective insulating substrate comprises a high thermal conductive ceramic having a thermal conductivity equal to or more than W/(m*K) and a difference between a linear expansion coefficient of the respective insulating substrate and a linear expansion coefficient of the respective semiconductor element in a temperature range of 20-300° C. is less than $1 \times 10^{-5}$ /K, wherein a thickness of each of the insulating substrates at a bottom surface of the recess is 10-250 μm, and the semiconductor element is closely joined, with a conductive adhesive, to the inner wall surface of the recess at a surface of the semiconductor element that does not have any electrode pads thereon; further comprising a plurality of insulating resin layers covering the semiconductor elements and the insulating substrates, respectively, and a plurality of conductor wirings formed over the insulating resin layers, respectively, wherein the plurality of insulating substrates has a plurality of connecting paths, respectively, each of the connecting paths comprises an electrically conducting material and is electrically connecting first and second faces of a respective one of the insulating substrates, the plurality of semiconductor elements has a plurality of electrode pads, respectively, and the conductor wirings extending to the connecting paths and the electrode pads through the insulating resin layers, respectively, and connecting the connecting paths to the electrode pads, respectively.

7. A semiconductor element built-in type multilayered circuit board according to claim 6, further comprising a plurality of electrically conductive bumps connected to the connecting paths, respectively, wherein the boards are laminated and electrically connected to each other through the electrically conductive bumps.

8. A semiconductor element built-in type multilayered circuit board according to claim 6, wherein a height difference from a surface of each of the electrode pads to a surface of a respective one of the insulating substrates is within 10 μm.

9. A semiconductor element built-in type multilayered circuit board according to claim 6, wherein the high thermal conductive ceramic comprises aluminum nitride.

10. The semiconductor element built-in type multilayered circuit board of claim 6, wherein said conductive adhesive comprises epoxy based silver paste.

* * * * *